United States Patent [19]

Adachi et al.

[11] Patent Number: 5,029,984
[45] Date of Patent: Jul. 9, 1991

[54] LIQUID CRYSTAL DISPLAY DEVICE

[75] Inventors: Kohei Adachi; Hideaki Otsuki; Kenichi Niki; Hayato Takasago; Tetsuro Makita, all of Hyogo, Japan

[73] Assignee: Mitsubishi Denki Kabushiki Kaisha, Tokyo, Japan

[21] Appl. No.: 307,739

[22] Filed: Feb. 8, 1989

[30] Foreign Application Priority Data

Mar. 15, 1988 [JP] Japan .................................. 63-62137
Mar. 15, 1988 [JP] Japan .................................. 63-62138

[51] Int. Cl.$^5$ ............................................. G02F 1/133
[52] U.S. Cl. .................................. 350/334; 350/343; 350/345; 350/336
[58] Field of Search .............. 350/330, 332, 334, 345, 350/336, 343, 331 R; 340/716, 718; 439/66, 86, 91

[56] References Cited

U.S. PATENT DOCUMENTS

| | | | |
|---|---|---|---|
| 4,065,197 | 12/1977 | Kuist et al. | 439/66 |
| 4,474,432 | 10/1984 | Takamatsu et al. | 350/336 |
| 4,499,459 | 2/1985 | Sasaki et al. | 350/333 |
| 4,514,042 | 4/1985 | Nukii et al. | 350/334 X |
| 4,549,174 | 10/1985 | Funada et al. | 350/336 |
| 4,629,289 | 12/1986 | Streit | 350/332 X |
| 4,655,551 | 4/1987 | Washizuki et al. | 350/334 |
| 4,690,510 | 9/1987 | Takamatsu et al. | 350/334 |
| 4,727,285 | 2/1988 | Taniguchi | 350/330 X |
| 4,746,198 | 5/1988 | Baeger | 350/334 X |
| 4,755,035 | 7/1988 | Kopish et al. | 350/334 X |
| 4,836,651 | 6/1989 | Anderson | 350/334 |
| 4,896,946 | 1/1990 | Suzuki et al. | 350/336 |
| 4,917,466 | 4/1990 | Nakamura et al. | 350/336 |

FOREIGN PATENT DOCUMENTS

| | | | |
|---|---|---|---|
| 62-229089 | 11/1985 | Japan | 350/334 |
| 0167925 | 7/1986 | Japan | 350/334 |
| 62-143086 | 6/1987 | Japan | 350/334 |

Primary Examiner—Stanley D. Miller
Assistant Examiner—Tai V. Duong
Attorney, Agent, or Firm—Burns, Doane, Swecker & Mathis

[57] ABSTRACT

In a liquid crystal display device with a drive circuit board connected to the peripheral portion of a liquid crystal display panel, the circuit board is disposed behind the liquid crystal display panel and also the circuit board is connected with the liquid crystal display panel by means of a connecting member in film form, whereby the liquid crystal display device is miniaturized and efficiency of the assembly work is improved. Further, the circuit board is made up of plural drive circuit modules of the same type whereby the efficiency in the assembly and inspection process is still improved.

2 Claims, 5 Drawing Sheets (a)

(b)

LIQUID CRYSTAL DISPLAY DEVICE

BACKGROUND OF THE INVENTION

1. Field of the Invention

The present invention relates to a liquid crystal display device for use in a display for office automation equipment, computers, television receivers, or the like as a substitute for a cathode ray tube.

2. Description of the Prior Art

CRTs (cathode ray tubes) have so far been widely used as a display in the peripheral equipment of office machines, computers, and so on. But nowadays liquid crystal display devices are progressively replacing the CRTs because they can be miniaturized, consume smaller power, and are obtainable at low cost.

FIG. 1 is a sectional view of a prior art liquid crystal display device disclosed, for example, in Japanese Laid-open Patent Publication No. 60-229089 and FIG. 2 is a perspective view of the same. Referring to the figures, reference numeral 1 denotes a liquid crystal display panel composed of two glass plates 2, 3 with a transparent conductive film formed thereon, a sealant 4 for joining the glass plates 2, 3 together at their peripheral portions, liquid crystals 5, and polarizing plates 6 stuck onto the front and the back of the glass plates 2, 3. In the case of an active matrix display, thin-film transistors are formed on the glass plate 3, and of a color display, a color filter is formed on the glass plate 2 or 3. Reference numeral 7 denotes a drive IC for supplying an electric signal necessary for the liquid crystal display panel 1, and 8 denotes a protection coating for moisture proofing and mechanical protection and reinforcement of the drive IC 7. Reference numeral 10 denotes a circuit board having a plurality of drive ICs mounted thereon and having a conductive pattern providing a drive circuit for the liquid crystal display panel formed thereon. A flexible printed board formed of a polyimide film is normally used for the circuit board 10 and it is provided with a reinforcement lining plate 9 stuck onto its back side. As another prior art arrangement, there is such as disclosed, for example, in Japanese Laid-open Patent Publication No. 62-238684, in which a plurality of film carriers with a drive IC connected thereto are coupled with a rigid printed board with a conductive pattern serving as a drive circuit provided thereon.

For connecting the circuit board 10 with the liquid crystal display panel 1, such methods are used as soldering, thermocompression bonding using an anisotropic conductive film and so on, mechanical pressure joining, or the like. On a transparent conductive film 11, there is provided Ni or Ni/Au coating, pretinning or the like, according to the need. The circuit boards 10a, 10b, 10c connected with each side of the liquid crystal display panel 1 are interconnected with each other by means of a flexible printed board, a flat cable, wire bonding, or the like. Reference numeral 12 denotes a light box casing fixed to the back side of the glass plate 3 and contains a lamp 13, a reflecting plate 14, and a light diffusing plate 15.

Since the liquid crystal display device organized as described above has the circuit board 10, together with the reinforcement lining plate 9, stuck to the periphery of the liquid crystal display panel 1, it becomes larger in size than the liquid crystal display surface by the width of the circuit board 10 disposed at the periphery, and therefore miniaturization of the device cannot be attained. Further, as the liquid crystal display becomes larger in size, the flexible printed board of a polyimide film tends to produce large changes in its dimensions by the effects of temperature and moisture, causing the terminals of the circuit board 10 to deviate from the positions for connection with the liquid crystal display panel 1 at each edge thereof and making the alignment difficult. In the case where a plurality of film carriers are used, the number of times of alignment performed for terminal connection and the number of connections increase, and therefore, a longer processing time is required and automatic assembling becomes difficult.

In order to improve quality of images and fineness of patterns displayed on the liquid crystal display device, there has been developed a liquid crystal display device of an active matrix type with switching elements of thin-film transistors arranged in a matrix. FIG. 3 is a partial plan view of terminal portions to be connected with a drive circuit module of a liquid crystal display panel incorporating such thin-film transistors therein. Referring to the figure, reference numeral 1 denotes the liquid crystal display panel, 3 denotes an array substrate formed of a glass plate with thin-film transistors provided thereon, 2 denotes a counter substrate formed of a glass plate with a transparent electrode provided all over its surface, and 4 denotes a seal portion for joining the array substrate 3 and the counter electrode 2 together, thereby forming them into a liquid crystal cell. Reference numeral 21 denotes a group of transparent electrode terminals led out from the source electrodes of the thin-film transistors and reference numeral 22 denotes a group of transparent electrode terminals led out from the gate electrodes of the same. While one group of transparent electrode terminals 21 are connected with a group of output terminals of a drive circuit module with a plurality of ICs for image data processing mounted thereon, the other group of transparent electrode terminals 22 are connected with a group of output terminals of another drive circuit module with a plurality of ICs for linear scanning circuits mounted thereon.

FIG. 4(a) and FIG. 4(b) show an example of connection of a liquid crystal display panel with drive circuit modules in an active matrix liquid crystal display device disclosed in Japanese Laid-open Patent Publication No. 60-229090. Denoted by 1 to 4 are the same parts as those denoted by the same reference numerals in the liquid crystal display panel shown in FIG. 3. Reference numeral 5 denotes liquid crystals sandwiched in between the array substrate 3 and the counter substrate 2, 10 denotes a circuit board made of ceramic, glass, glass epoxy, glass polyimide, or the like, 7 denotes an IC chip mounted on the circuit board 10, 23 denotes a bonding wire connecting the circuit board 10 with the IC chip 7, and these parts together constitute a drive circuit module 18. The transparent electrode terminals (not shown) formed on the array substrate 3 are provided with Au coating or the like in advance, and the drive circuit module 18 is connected with the array substrate 3 by means of wire bonding 28. Further, the drive circuit modules 18a, 18b, 18c, and 18d are interconnected with each other by means of wire bonding, a flat cable, or a flexible printed board (all of which are not shown).

Since the active matrix liquid crystal display device organized as described above has the configuration in which the drive circuit module 18 is fixedly stuck onto the array substrate 3, the array substrate is required to have a size large enough to provide the region on which the drive circuit module 18 is fixed in addition to the area in which the groups of the transparent electrode terminals are disposed. Thus, there has been a problem that the external size of the device becomes too large for the display area. Further, the ICs for image data processing and the ICs for linear scanning circuits, mounted on the drive circuit modules 18 for supplying signals to the opposing groups of the transparent electrode terminals 21 or 22 on the source side or the gate side, are each of the same function but the positions of the output terminals are inverted, and therefore, chips in which output sequences rotate in the opposite directions, so-called mirror chips, are required. Thus, it is required to change the patterns on the circuit board 10 and the programs used for automatic IC bonding, and further, the drive circuit modules 18 must be classified according to their uses. Efficiency of the assembly work has therefore been impaired.

As a measure to solve such problems, it is considered to arrange the groups of terminals on the circuit board 10 constituting the drive circuit modules 18 to be common for all the four sides of the circuit board or to be common for the upper and lower two sides and for the left and right two sides of the circuit board, as in the prior art liquid crystal display device shown in FIG. 1 and FIG. 2. Then, for example, the drive circuit modules in common can be used for image data processing circuits at the upper and the lower sides of the liquid crystal display panel and the drive circuit modules in common can be used for linear scanning circuits at the left and the right sides of the liquid crystal display panel. Thus, unification of the used ICs and improvement in the yield rate in the assembly work can be expected. However, since the groups of the terminals connected with the array substrate 3 are provided at the opposing two edges of the periphery of the substrate, the size of the circuit board becomes still larger than that in the liquid crystal display device shown in FIG. 4, and therefore, the array substrate 3 for having the drive circuit module 18 fixedly stuck thereto must also be made still larger, thus hindering the miniaturization of the device. Further, there has been a problem that the number of wires for forming the groups of terminals at two sides becomes very large, whereby multilayer wiring have had to be provided.

SUMMARY OF THE INVENTION

The present invention was made to overcome the above mentioned problems. Accordingly, an object of the present invention is to provide a liquid crystal display device in which operating efficiency in the assembly work and the yield rate of the drive circuit boards are improved and the miniaturization of the device can be achieved.

In a liquid crystal display device with a circuit board including drive ICs and drive circuits connected at the peripheral portion of a liquid crystal display panel, the liquid crystal display device according to the present invention has the circuit board disposed behind the liquid crystal display panel and comprises a connecting member in film form for electrically connecting the panel with the circuit board.

According to the present invention, the circuit board connected to the liquid crystal display panel does not protrude from the periphery of the panel, thereby enabling miniaturization of the liquid crystal display device.

Another object of the present invention is to provide an active matrix liquid crystal display device, wherein, in connecting opposing drive circuit modules on each of the source side and the gate side to the liquid crystal display panel, drive circuit modules composed of ICs of the same type and circuit boards of the same type are used, whereby the assembly process is simplified, the yield rate in the assembly work is improved, and further, miniaturization of the device is achieved.

DETAILED DESCRIPTION OF THE PREFERRED EMBODIMENTS

Figure 5:
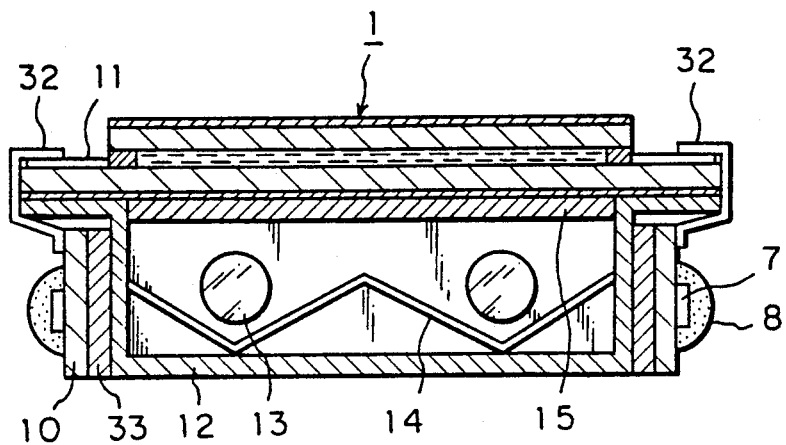
FIG. 5 is a sectional view of a liquid crystal display device according to an embodiment of the present invention.
Figure 6:
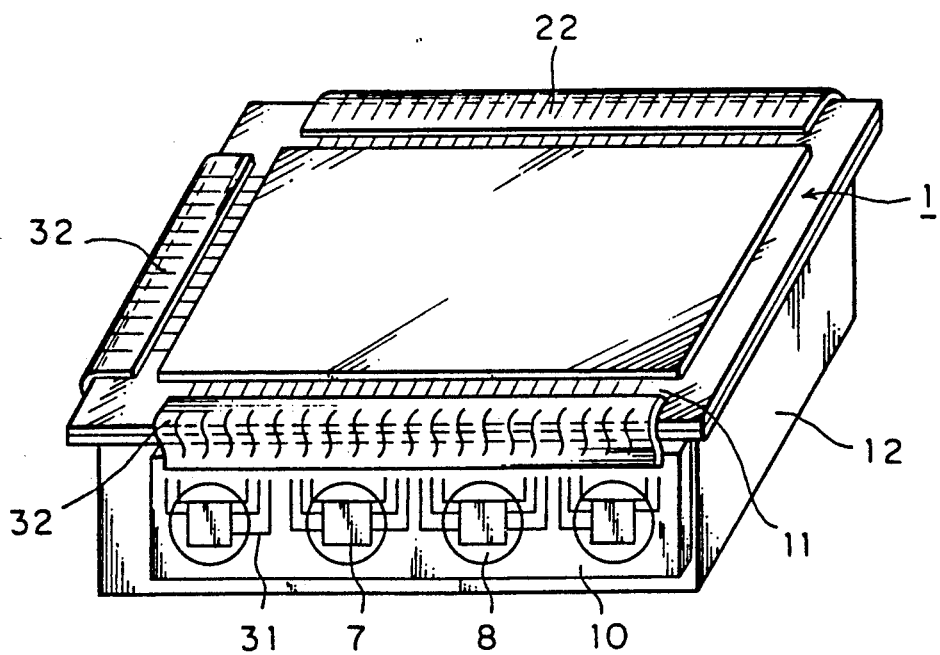
FIG. 6 is a perspective view of the same.

An embodiment of the present invention will be described below with reference to the accompanying drawings. FIG. 5 is a sectional view of a liquid crystal display device according to the present invention and FIG. 6 is a perspective view of the same. Referring to the figures, reference numeral 1 denotes a liquid crystal display panel of the same structure as that of the prior art, 10 denotes a rigid circuit board of glass epoxy, heat-resisting glass epoxy, glass polyimide, or the like, and on which are disposed, the same as in the prior art example, drive ICs 7, protecting coatings 8, and conductive patterns 31. The circuit board 10 is disposed behind the liquid crystal display panel 1 perpendicularly to the same, stuck to a light box casing 12 through a heat insulating member 33 made of a non-heat-conductive material such as foam plastics. Reference numeral 32 denotes a connecting member in film form which electrically connects a transparent conductive film 11 formed on the glass plate as a constituent of the liquid crystal display panel 1 with the circuit board 10.

Now the method for fabricating the liquid crystal display device according to the present invention will be described. A plurality of drive ICs 7 are stuck onto a heat-resisting glass epoxy substrate of a thickness of 0.5 to 1.0 mm, and then wire bonding is performed and protecting coatings 8 for improving moisture resistance, mechanical protection, and reinforcement are provided therefor, and thereby, a circuit board 10 for driving a liquid crystal display panel is formed. Then, as the connecting member in film form 32 for connecting the liquid crystal display panel 1 with the circuit board 10 is employed a heat seal connector, which is formed by using a 35 μm-thick polyester film as the base and providing thereon by pattern printing conductive portions made up of a layer of thermosetting resin including silver powder or carbon powder and a layer of hot melt resin including carbon powder put thereon and insulating portions of hot melt insulating resin. In the heat seal connector according to the present invention, while the pitch between the conductor portions is 0.3 to 0.5 mm and the length of the conductive portions is 8 to 20 mm, the widths of the connecting portions with the liquid crystal display panel 1 and the circuit board 10 are each 2 to 3 mm and the length of the connecting portions is 50 to 200 mm. Thermal compression bonding of the heat seal connector is performed, after the pattern is aligned with their corresponding terminals, by applying a heat block normally heated to 150° to 180° C. to the connecting area under a pressure of 20 to 30 kg/cm² for 10 to 30 seconds, and thereby, the terminals in a row are connected at a time.

As for the assembly procedures, after the circuit board 10 has been first checked at an inspection process to assure that it operates normally, the row of terminals formed on the circuit board 10 are aligned with the printed row of conductive patterns of the heat seal connector and they are subjected to the thermal compression bonding. Thereafter, the row of the conductive patterns on the other side of the heat seal connector are thermal-compression bonded with the liquid crystal display panel in the same way as the other patterns have been done with the circuit board 10. At this time, it is not necessarily needed to apply metal plating to the transparent conductive film 11, but thermal compression on the transparent conductive film 11 formed on the glass plate provides good electrical connections. The light box casing 12 and the circuit board 10 with a foam urethane or foam styrol sheet of a thickness of 1 to 2 mm as a heat insulating member sandwiched in between are fixed together by means of a double-side adhesive tape or an adhesive agent. And the circuit boards 10 arranged at the sides of the liquid crystal display panel 1 are interconnected with each other through a flat cable or a flexible printed board by soldering or using a connector.

Figure 1:
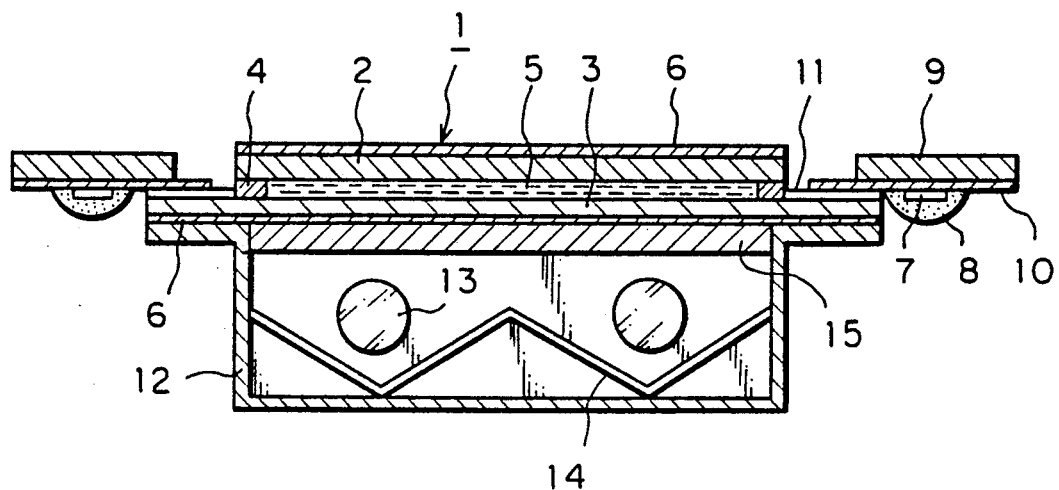
FIG. 1 is a sectional view of a prior art liquid crystal display device.
Figure 7:
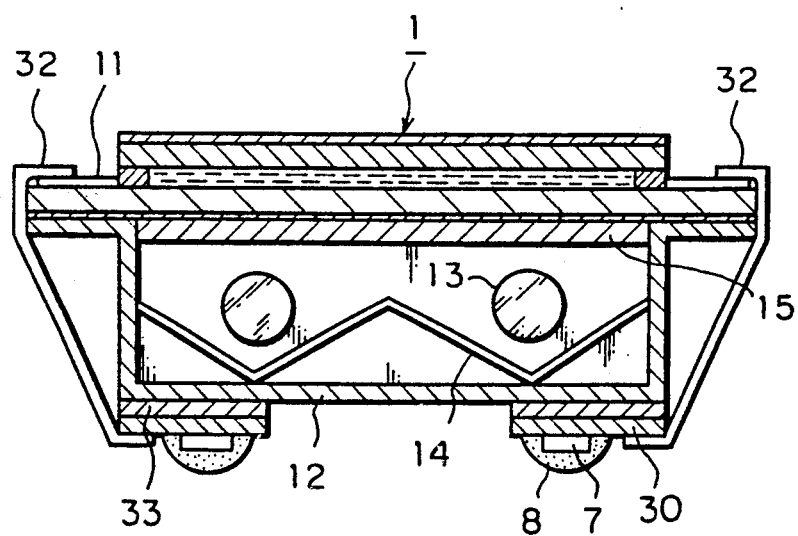
FIG. 7 is a sectional view of a liquid crystal display device according to a second embodiment.
Figure 2:
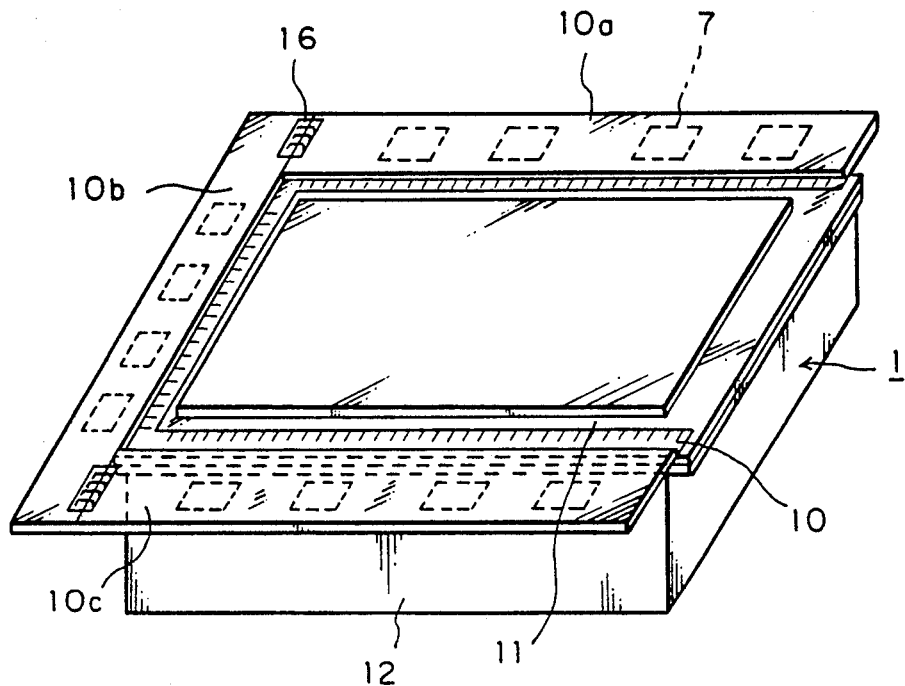
FIG. 2 is a perspective view of the same.
Figure 3:
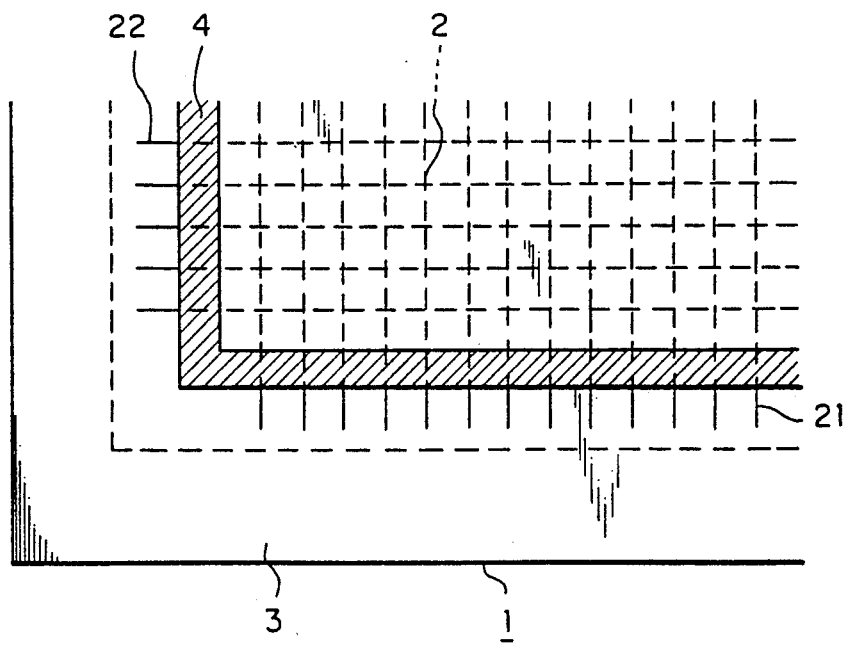
FIG. 3 is a partial plan view of a group of terminals of a liquid crystal display panel incorporating thin-film transistors therein.
Figure 4:
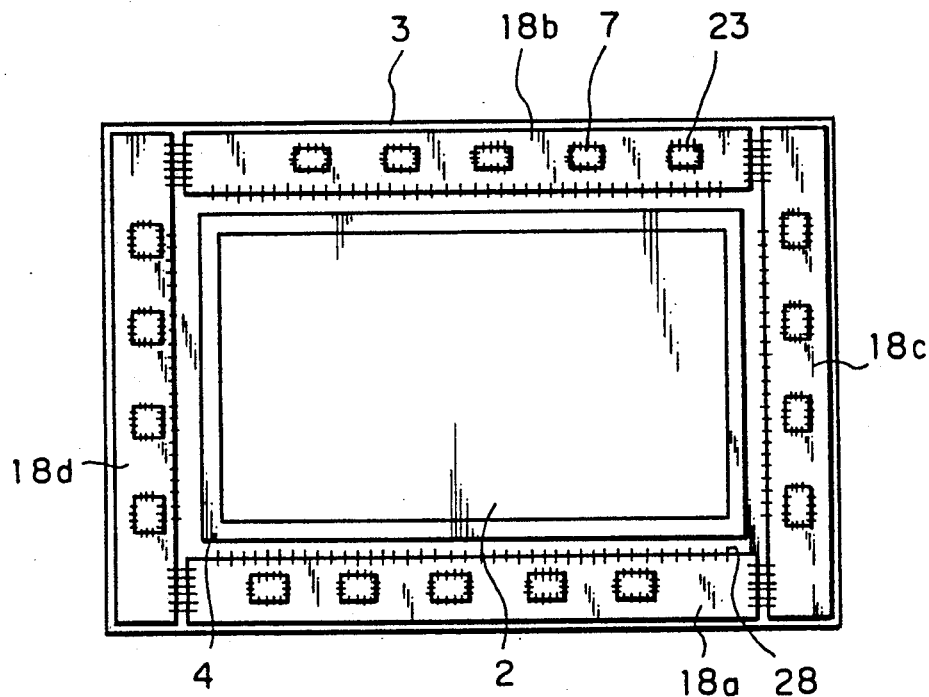
FIG. 4(a) and FIG. 4(b) are a plan view and a sectional view showing a liquid crystal display panel and drive circuit modules of a prior art active matrix liquid crystal display device.
Figure 4:
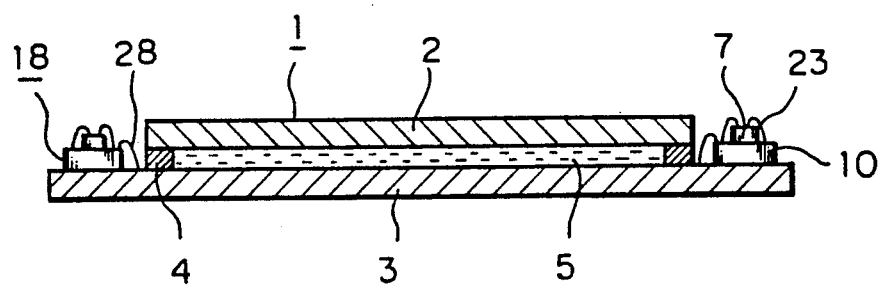

Although, in the above described embodiment, an instance was shown in which the circuit board 10 was disposed behind the liquid crystal display panel 1 perpendicularly to the same, the circuit board 10, depending on the shape of the light box casing 12, may be disposed behind the liquid crystal display panel 1 turned inward making an acute angle with the same. Or as in a second embodiment of the present invention shown in FIG. 7, the circuit board 10 may be disposed behind the light box casing 12, parallel to the liquid crystal display panel 1.

Further, as the connecting member in film form 32 other than the heat seal connector, a flexible printed board composed of a polyimide or polyester film with conductive patterns formed thereon by copper foil etching may be used, and in this case, connection may be advantageously performed by soldering or thermal compression with the use of an anisotropic conductive film.

Further, as the heat insulating means between the light box casing 12 and the circuit board 10 other than a foam plastic sheet sandwiched in between, simply fixing these members to each other using screws with an air gap left therebetween may be applicable.

Figure 8:
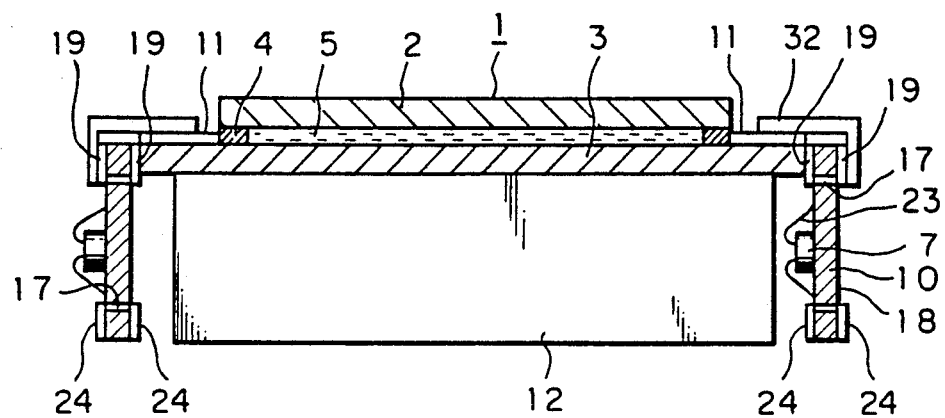
FIG. 8 is a partially sectional view of a liquid crystal display device according to a third embodiment of the present invention of which drive circuit modules and a liquid crystal display panel are connected with each other.

FIG. 8 is a partially sectional view of a liquid crystal display device according to a third embodiment of the present invention, of which drive circuit modules and a liquid crystal display panel are connected with each other. Referring to the figure, reference numeral 18 denotes a drive circuit module using as the base a rigid circuit board made of glass epoxy, glass polyimide, or the like, 7 denotes an IC chip mounted on the circuit board 10 of the module, 23 denotes a bonding wire connecting the circuit board 10 with the IC chip 7, 19 denotes a group of terminals provided at an edge portion of the circuit board to be connected with a group of gate electrode terminals or source electrode terminals, 24 denotes a row of input terminals for receiving control signals from a control circuit not shown, and 17 denotes via holes for forming the group of terminals 19 and the raw of input terminals 24 on both upper and lower sides of the board. Reference numeral 32 denotes a connecting member in film form for electrically connecting the group of terminals of the liquid crystal display panel 1 with the group of terminals 19 of the drive circuit module 18. Reference numeral 12 denotes a light box casing.

In an active matrix liquid crystal display device, drive circuit modules of the same type are used opposing each other on each of the source side and the gate side. By arranging, as shown in FIG. 8, such that the stuck face of the circuit board 10 on the left of the liquid crystal display panel 1 is the face mounting the IC thereon, whereas that on the right is the opposite face to the face mounting the IC thereon, the connecting member in film form 32 of one-side adhesive type can be used for connection without folding it back.

Figure 9:
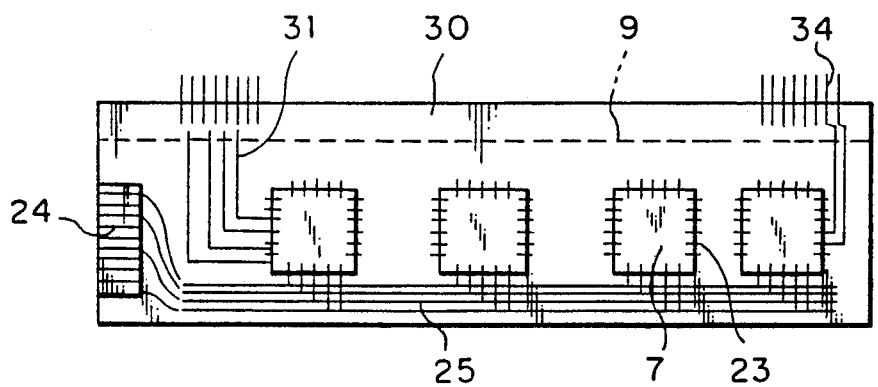
FIG. 9 and FIG. 10 are a front view of a drive circuit module for a liquid crystal display device according to a fourth embodiment of the present invention, and a partially sectional view of the same of which drive circuit modules and a liquid crystal display panel are connected with each other.
Figure 10:
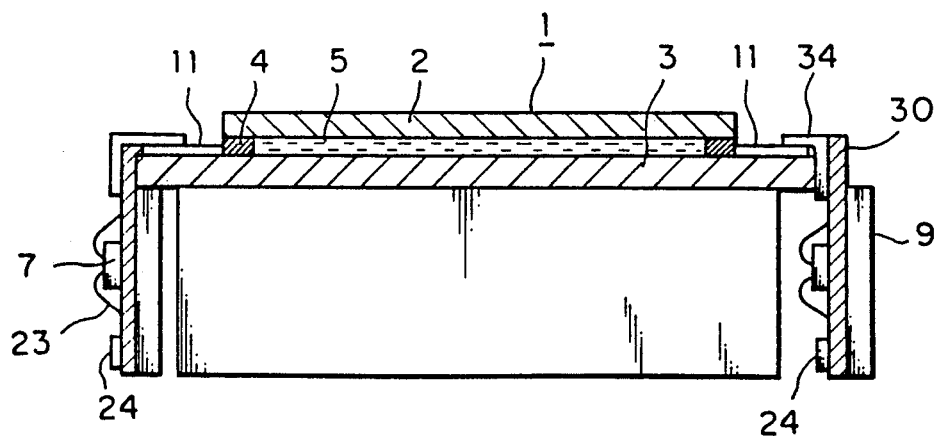

FIG. 9 is a front view of a drive circuit module used in a fourth embodiment and FIG. 10 is a partially sectional view of the drive circuit module in connection with a liquid crystal display panel. Referring to FIG. 9, reference numeral 30 denotes a flexible circuit board, 7 denotes an IC chip mounted on the flexible circuit board 30, 23 denotes a bonding wire connecting the flexible circuit board 30 with the IC chip 7, 24 denotes a row of input terminals for receiving control signals from a control circuit not shown, 25 denotes a common line for supplying an input signal to a plurality of ICs, 34 denotes a group of connecting conductors formed in a state projecting from the flexible circuit board 30, 31 denotes lead conductive patterns for conducting output signals of the IC to the group of conductors 34, and 9 denotes a reinforcement lining plate for the flexible circuit board 30. Referring to FIG. 10, reference numeral 1 denotes the liquid crystal display panel, and transparent conductive film 11 formed on the liquid crystal display panel 1 and the group of connecting conductors 34 projecting from the flexible circuit board 30 are connected with each other by soldering, thermal compression with the use of an anisotropic conductive film, or the like. Here, the drive circuit modules on the left and the right are of the same type but, after establishment of the connections between the liquid crystal display panel and the drive circuit modules, the groups of conductors 34 on both sides are folded in the opposite directions.

When the flexible circuit board 30 is used, dimensional changes occur by the effects of temperature and absorbed moisture as described above, and hence, the use of the same is disadvantageous in terms of efficiency of the operation, but it is thereby made easy to dispose the circuit board behind the liquid crystal display panel so as not to protrude from the edge portion of the panel.

What is claimed is:

1. A liquid crystal display device comprising:
   a liquid crystal display panel; and
   a drive circuit for said liquid crystal display panel connected to a peripheral portion of said display panel, said drive circuit comprising a plurality of drive circuit modules each having a plurality of ICs mounted on a circuit board arranged on a rear surface of said liquid crystal display panel in a direction substantially perpendicular thereto, the ICs and interconnection of the ICs on one board being substantially the same as on any other, the drive circuit modules and the liquid crystal display panel being electrically connected by a film-like connecting material, one of said drive circuit modules having an IC mounting surface as a connecting surface and another of said drive circuit modules having an opposite surface of the IC mounting surface as a connecting surface.

2. A liquid crystal display device according to claim 1, wherein the liquid crystal display panel includes a transparent conductive film formed on a glass plate of the liquid crystal display panel, and the circuit board includes a row of terminals formed on the circuit board, and wherein the film-like connection material comprises a heat seal type connector having an electrical conductor part and an insulation part pattern printed thereon and which is thermally pressed to said transparent conductive film and the row of terminals.

* * * * *